(12) United States Patent
Krüger et al.

(10) Patent No.: US 7,608,789 B2
(45) Date of Patent: Oct. 27, 2009

(54) COMPONENT ARRANGEMENT PROVIDED WITH A CARRIER SUBSTRATE

(75) Inventors: Hans Krüger, Munich (DE); Alois Stelzl, Munich (DE)

(73) Assignee: EPCOS AG, Munich (DE)

( * ) Notice: Subject to any disclaimer, the term of this patent is extended or adjusted under 35 U.S.C. 154(b) by 186 days.

(21) Appl. No.: 11/573,610

(22) PCT Filed: Aug. 2, 2004

(86) PCT No.: PCT/EP2005/008373

§ 371 (c)(1),
(2), (4) Date: Jun. 5, 2007

(87) PCT Pub. No.: WO2004/019490

PCT Pub. Date: Mar. 4, 2004

(65) Prior Publication Data

US 2008/0038577 A1   Feb. 14, 2008

(30) Foreign Application Priority Data

Aug. 12, 2004  (DE) .................. 10 2004 039 229

(51) Int. Cl.
   *H01L 23/28* (2006.01)
(52) U.S. Cl. .................. 174/521; 174/255; 174/260; 257/778; 257/698; 257/737
(58) Field of Classification Search .................. 174/521, 174/528, 536, 551, 255, 260; 257/698, 778, 257/737
See application file for complete search history.

(56) References Cited

U.S. PATENT DOCUMENTS

| | | | |
|---|---|---|---|
| 3,587,322 A | 6/1971 | Lobdell et al. | |
| 3,726,002 A * | 4/1973 | Greenstein et al. | ............ 29/832 |
| 4,424,419 A | 1/1984 | Chaput et al. | |
| 4,454,440 A | 6/1984 | Cullen | |
| 4,545,440 A | 10/1985 | Treadway | |
| 4,866,683 A | 9/1989 | Phillips | |
| 5,059,848 A | 10/1991 | Mariani | |
| 5,091,051 A | 2/1992 | Greer | |
| 5,184,107 A | 2/1993 | Maurer | |
| 5,216,490 A | 6/1993 | Greiff et al. | |
| 5,465,008 A | 11/1995 | Goetz et al. | |
| 5,650,685 A | 7/1997 | Kosinski et al. | |
| 5,739,585 A | 4/1998 | Akram et al. | |

(Continued)

FOREIGN PATENT DOCUMENTS

DE          198 06 818          11/1999

(Continued)

OTHER PUBLICATIONS

International Search Report for PCT/EP2005/008373.

(Continued)

*Primary Examiner*—Hung V Ngo
(74) *Attorney, Agent, or Firm*—Fish & Richardson P.C.

(57) ABSTRACT

A component arrangement includes a carrier substrate having at least one component arranged thereon. The carrier substrate contains at least one layer of glass film and an intermediate layer, which is mounted on at least one side of the glass film. The component is covered and sealed by a cover layer mounted on the carrier substrate.

20 Claims, 5 Drawing Sheets

U.S. PATENT DOCUMENTS

| | | | |
|---|---|---|---|
| 5,990,418 A | 11/1999 | Bivona et al. | |
| 6,057,222 A | 5/2000 | Pahl et al. | |
| 6,136,175 A | 10/2000 | Stelzl et al. | |
| 6,150,753 A | 11/2000 | DeCastro | |
| 6,178,249 B1 | 1/2001 | Hietanen et al. | |
| 6,182,342 B1 | 2/2001 | Sawin | |
| 6,187,249 B1 | 2/2001 | Lewellin | |
| 6,242,842 B1 | 6/2001 | Pahl et al. | |
| 6,310,420 B1 | 10/2001 | Pahl et al. | |
| 6,324,907 B1 | 12/2001 | Halteren et al. | |
| 6,398,943 B1 | 6/2002 | Arens-Fischer et al. | |
| 6,400,065 B1 | 6/2002 | Toda et al. | |
| 6,413,408 B1 | 7/2002 | Berger et al. | |
| 6,433,412 B2 | 8/2002 | Ando et al. | |
| 6,449,828 B2 | 9/2002 | Pahl et al. | |
| 6,492,194 B1 | 12/2002 | Bureau et al. | |
| 6,519,822 B1 | 2/2003 | Stelzl et al. | |
| 6,528,924 B1 | 3/2003 | Stelzl et al. | |
| 6,530,515 B1 | 3/2003 | Glenn et al. | |
| 6,555,758 B1 | 4/2003 | Stelzl et al. | |
| 6,566,672 B1 | 5/2003 | Schlough et al. | |
| 6,613,605 B2 | 9/2003 | Pace | |
| 6,614,911 B1 | 9/2003 | Watson et al. | |
| 6,649,446 B1 | 11/2003 | Goetz et al. | |
| 6,674,159 B1 | 1/2004 | Peterson et al. | |
| 6,685,168 B1 | 2/2004 | Stelzl et al. | |
| 6,722,030 B1 | 4/2004 | Stelzl et al. | |
| 6,732,588 B1 | 5/2004 | Mullenborn et al. | |
| 6,781,231 B2 | 8/2004 | Minerevini | |
| 6,800,987 B2 | 10/2004 | Toda | |
| 6,809,413 B1 | 10/2004 | Peterson et al. | |
| 6,829,131 B1 | 12/2004 | Loeb et al. | |
| 6,838,739 B2 | 1/2005 | Stelzl et al. | |
| 6,904,155 B2 | 6/2005 | Yonehara et al. | |
| 6,909,183 B2 | 6/2005 | Feiertag et al. | |
| 6,924,429 B2 | 8/2005 | Kasai et al. | |
| 6,924,974 B2 | 8/2005 | Stark | |
| 6,930,364 B2 | 8/2005 | Bruner | |
| 6,982,380 B2 | 1/2006 | Hoffman et al. | |
| 7,053,456 B2 | 5/2006 | Matsuo | |
| 7,072,482 B2 | 7/2006 | Van Doorn et al. | |
| 7,092,539 B2 | 8/2006 | Sheplak et al. | |
| 7,094,626 B2 | 8/2006 | Stelzl et al. | |
| 7,146,016 B2 | 12/2006 | Pedersen | |
| 7,166,910 B2 | 1/2007 | Minervini | |
| 7,242,089 B2 | 7/2007 | Minervini | |
| 7,259,041 B2 | 8/2007 | Stelzl et al. | |
| 7,388,281 B2 | 6/2008 | Krueger et al. | |
| 7,518,201 B2 | 4/2009 | Stelzl et al. | |
| 7,518,249 B2 | 4/2009 | Krueger et al. | |
| 2001/0010444 A1 | 8/2001 | Pahl et al. | |
| 2002/0074239 A1 | 6/2002 | Berger et al. | |
| 2002/0076910 A1 | 6/2002 | Pace | |
| 2002/0110256 A1 | 8/2002 | Watson et al. | |
| 2003/0010530 A1 | 1/2003 | Scheel et al. | |
| 2003/0034536 A1 | 2/2003 | Scheeper et al. | |
| 2003/0035558 A1 | 2/2003 | Kawamura et al. | |
| 2003/0047806 A1 | 3/2003 | Stelzl et al. | |
| 2003/0124829 A1 | 7/2003 | Pace | |
| 2003/0133588 A1 | 7/2003 | Pedersen | |
| 2003/0151133 A1 | 8/2003 | Kinayman et al. | |
| 2004/0046245 A1 | 3/2004 | Minervini | |
| 2004/0058473 A1 | 3/2004 | Feiertag et al. | |
| 2004/0118595 A1* | 6/2004 | Flammer et al. | 174/254 |
| 2004/0150939 A1 | 8/2004 | Huff | |
| 2004/0161530 A1 | 8/2004 | Stark | |
| 2004/0231872 A1* | 11/2004 | Arnold et al. | 174/35 R |
| 2004/0237299 A1 | 12/2004 | Stelzl et al. | |
| 2004/0239449 A1 | 12/2004 | Stelzl et al. | |
| 2005/0018864 A1 | 1/2005 | Minervini | |
| 2005/0034888 A1 | 2/2005 | Hoffmann et al. | |
| 2005/0121785 A1 | 6/2005 | Stelzl et al. | |
| 2005/0185812 A1 | 8/2005 | Minervini | |
| 2005/0218488 A1 | 10/2005 | Matsuo | |
| 2006/0151203 A1 | 7/2006 | Krueger et al. | |
| 2006/0157841 A1 | 7/2006 | Minervini | |
| 2006/0249802 A1 | 11/2006 | Stelzl et al. | |
| 2007/0082421 A1 | 4/2007 | Minervini | |
| 2007/0099327 A1 | 5/2007 | Hartzell et al. | |
| 2007/0127982 A1 | 6/2007 | Bohlen et al. | |
| 2007/0201715 A1 | 8/2007 | Minervini | |
| 2007/0202627 A1 | 8/2007 | Minervini | |
| 2007/0222056 A1 | 9/2007 | Bauer et al. | |
| 2008/0038577 A1 | 2/2008 | Kruger et al. | |
| 2008/0048317 A1 | 2/2008 | Krueger et al. | |
| 2008/0279407 A1 | 11/2008 | Pahl et al. | |
| 2009/0001553 A1 | 1/2009 | Pahl et al. | |
| 2009/0071710 A1 | 3/2009 | Stelzl et al. | |
| 2009/0104415 A1 | 4/2009 | Schmajew et al. | |

FOREIGN PATENT DOCUMENTS

| | | |
|---|---|---|
| DE | 199 61 842 | 7/2001 |
| DE | 101 45 100 | 6/2002 |
| DE | 103 03 263 | 8/2004 |
| DE | 202005001559 | 6/2005 |
| DE | 10 2005 008 512 | 8/2006 |
| EP | 0 742 643 | 2/2002 |
| FR | 2 779 883 | 4/2001 |
| FR | 2 799 883 | 4/2001 |
| JP | 55-134942 | 10/1980 |
| JP | 57-100754 | 6/1982 |
| JP | 07-212180 | 8/1995 |
| JP | 07-212181 | 8/1995 |
| JP | 10-321666 | 12/1998 |
| WO | WO99/43084 | 8/1999 |
| WO | WO99/56390 | 11/1999 |
| WO | WO00/70630 | 11/2000 |
| WO | WO01/26136 | 4/2001 |
| WO | WO02/15636 | 2/2002 |
| WO | WO02/17364 | 2/2002 |
| WO | WO2004/019490 | 3/2004 |
| WO | WO2005/086532 | 9/2005 |
| WO | WO2007/022249 | 2/2007 |

OTHER PUBLICATIONS

Written Opinion for PCT/EP2005/008373.

English translation of Written Opinion PCT/EP2005/008373.

International Preliminary Report on Patentability in Application No. PCT/EP05/004309, dated Nov. 29, 2006.

International Search Report and Written Opinion in Application No. PCT/EP05/004309, dated Sep. 13, 2005.

International Preliminary Report on Patentability in Application No. PCT/DE2006/001736, dated Apr. 29, 2008.

International Search Report and Written Opinion in Application No. PCT/DE2006/001736, dated Mar. 12, 2007.

International Search Report and Written Opinion in Application No. PCT/DE2006/001946, dated Feb. 22, 2007.

International Preliminary Report on Patentability in Application No. PCT/DE2006/001946, dated Jun. 11, 2008.

International Search Report and Written Opinion in Application No. PCT/DE2006/001945, dated Mar. 28, 2007.

International Preliminary Report on Patentability No. PCT/DE2006/001945, dated Jun. 11, 2008.

International Search Report and Written Opinion in Application No. PCT/EP03/06596, dated Jan. 20, 2004.

Barton et al., "Optimisation of the Coating of a Fiber Optical Sensor Embedded in a Corss-ply GFRP Laminate" Composites: Part A 33 (2002) pp. 27-34.

Bergqvist et al., "A Silicon Condenser Microphone Using Bond and Etch-Back Technology", Sensors and Actuators A, vol. 45, pp. 115-124 (1994).

Hayes et al., "Micro-jet printing of polymers for electronics manufacturing" IEEE; pp. 168-173, XP 002342861 (1998).

Hayes et al., "Printing systems for MEMS packaging" vol. 4558, 2001, pp. 206-214, XP 002342860.
Oda et al., "New Nanostructured Film Making Method Using Ultra Fine Particles"; pp. 21-26.
Selmeier et al., "Recent Advances in Saw Packaging", IEEE Ultrasonics Symposium; 2001; pp. 283-292.
Torkkeli et al., "Capacitive Silicon Microphone", Physica Scripta., vol. T79, pp. 275-278 (1999).

van Heeren, et al., "Overview of MEMS Process Technologies for high Volume Electronics", 17 pgs. (Pub. Date: 2005 or later).
Action and Response History in U.S. Appl. No. 11/578,854, as retrieved from PAIR on May 19, 2009.
Action and Response History in U.S. Appl. No. 10/523,875, as retrieved from PAIR on May 19, 2009.

* cited by examiner

FIG 6

COMPONENT ARRANGEMENT PROVIDED WITH A CARRIER SUBSTRATE

TECHNICAL FIELD

This patent application describes a component arrangement with a carrier substrate and at least one component arranged on this substrate.

BACKGROUND

The integration of components can be performed, for example, on LTCC (low temperature co-fire ceramics) carrier substrates and/or on PCB (printed circuit boards). A significant advantage of LTCC is, among others, its low coefficient of thermal expansion, which minimizes thermal stress with silicon-based mounted structures, especially with components on silicon-based substrates. Advantages of PCB are low fabrication costs and exact positioning definition of connection pads. Disadvantages include, among others, lack of gas-tightness, relatively high water absorption, and a coefficient of thermal expansion not adapted to silicon-based flip-chip mounted structures. The flip-chip components used today on PCB may not be hermetically sealed, which is a condition that is especially disruptive for mounted filter structures in MEMS technology (micro-electro-mechanical system).

From DE 101 45 100 A1, a method is known for fabricating glass-based electronic components. There, a glass-based body is proposed, which has a monolithic multilayer construction, which contains at least one passive electronic component and also at least one layer made from glass.

In DE 199 61 842 A1, a multilayer circuit board with increased dimensional stability is proposed. By reducing the heat-generated expansion, the connections to the electronic components are subjected to smaller loads.

Furthermore, a multilayer circuit board which may include electronic components is shown, which has at least one layer, the thermal expansion behavior of which approximately corresponds to the thermal expansion behavior of the electronic component and also essentially determines the thermal expansion behavior of the multilayer circuit board. The layer is a glass layer or a glass-containing layer, which forms a homogeneous composite with other layer materials. As other layer materials, thermoplastic or duroplastic materials, metals, or electrically conductive or non-electrically conductive plastics are named.

For modern flip-chip components, which are arranged on a PCB, the problem arises that these may not have a hermetic, and especially not a gas-tight, construction. It is further problematic if the circuit board on which the component is mounted does not have a coefficient of expansion adapted to the component. For a circuit board or a carrier substrate made from LTCC, high cost is also a disadvantage. The shrinkage occurring when the LTCC substrates are sintered makes structuring more difficult and is also responsible for low integration density. In particular, for the design of mounted filter structures in MEMS technology, these disadvantages are especially relevant.

SUMMARY

Described herein is a component arrangement with a carrier substrate having a component that exhibits improved characteristics relative to the prior art.

The component arrangement has a carrier substrate and at least one component that is arranged on this substrate. The carrier substrate contains at least one layer made from glass film and one intermediate layer, which is applied at least to the glass film on one side. The component and the carrier substrate are covered by a cover layer. This cover layer, which covers the carrier substrate and the component, corresponds to a gas-tight cover.

In one embodiment, the carrier substrate comprises a composite made from glass film and at least one layer of LTCC. One advantage of this construction is produced from matching coefficients of expansion of the LTCC and the carrier substrate with the one or more glass films, which function as a PCB. This allows a high BGA density on the LTCC substrate and makes underfilling unnecessary in flip-chip bonded components.

The component itself can be a chip (bare die) supporting component functions, a substrate-supported component, which is, if necessary, is encapsulated or already provided with a cover, or a module, in which one or more components are arranged on a substrate and provided, if necessary, with a cover. Multilayer substrates can comprise integrated passive components and wiring.

In one configuration, the component contains a multilayer substrate and this substrate is mounted on the carrier substrate. Also, the substrate can have at least one layer of glass film and/or LTCC. With this construction, it is possible to construct the component arrangement as a module that can carry additional submodules. Furthermore, the submodules or substrates can be applied without stress to the carrier substrate.

In another configuration, the component may be arranged on the glass film without an additional intermediate layer. As mentioned above, coefficients of expansion of the carrier substrate (ca. 6-7 ppm/K for LTCC) with glass film (ca. 7 ppm/K) and the component are nearly identical in one direction (e.g., 7 ppm/K along one crystal axis and 14 ppm/K along the other crystal axis for $LiTaO_3$). Also, Si has a similar coefficient of thermal expansion of ca. 4 ppm/K. With this arrangement, the coefficients of expansion match is used advantageously.

In another embodiment, the component contains chip carrying component structures. This chip carrying component structures can be, for example, a filter construction in MEMS technology. These mounted filter structures, e.g., surface acoustic wave filters on a piezoelectric substrate, are less likely to be deformed, which is particularly advantageous. Furthermore, as a result, the chip carrying component structures can be arranged on the substrate or directly on the carrier substrate.

Glass films have nearly the same coefficient of thermal expansion as LTCC and are also gas-tight. Thus, a component arrangement, such as that described above, with a MEMS component (micro-electro-mechanical system), for example, a filter construction in SAW technology (surface acoustic wave filter) is hermetically protected from environmental effects.

Contact elements are arranged on the bottom side of the carrier substrate. These contact elements are connected electrically conductively to the component. The carrier substrate has feedthrough contacts, which extend from the top side where the component is mounted, toward the bottom side, and which are connected to the contact element.

Also, the possibly present substrate of the component can have feedthrough contacts. These feedthrough contacts connect the component to metallization on the bottom side of the substrate and extend from the top side to the bottom side of the substrate.

To better seal the component, at least two layers of glass film may be provided in the carrier substrate and feedthrough contacts may be provided that extend through this carrier substrate or substrate. Here, it is advantageous if the feedthrough contacts are offset relative to each other through the relevant layer of the glass film to the contact element. Thus, by avoiding straight-line bores or feedthrough contacts through the entire carrier substrate, a further increase in gas-tight sealing is achieved.

To improve the seal in the component further, in another embodiment, the cover layer may contain a glob top made from thermosetting resin. This glob top ensures a gas-tight seal of the component arrangement. The glob top can be applied directly over the component and then connect to the carrier substrate and thus seal the component against environmental effects. Under the glob top or before applying the glob top, the intermediate space between the component and carrier substrate can be sealed. For this purpose, a film, e.g., a laminate film or an underfiller can be used. The laminate film can be applied over the entire component, so that it seals the component on the side with the carrier substrate.

To extend the seal, at least one cover layer has metallic characteristics. This also has the advantage of electromagnetic protection. The cover layer with metallic characteristics can be applied directly over the component. Advantageously, however, the intermediate space between the component and carrier substrate is sealed in advance. The cover layer with metallic characteristics, however, can also be applied over an already existing cover layer, e.g., over a laminate foil or over the glob top.

In another embodiment, the component arrangement on the carrier substrate has at least one metallic contact surface of the first type. The component contained in the component arrangement has at least one metallic contact surface of the second type. The electrical connection between these metallic contact surfaces may be implemented via bumps. This arrangement has a hollow space, which expands between the component and the carrier substrate. In this hollow space, component structures may be contained which are arranged on the side of the component or its substrate facing the carrier substrate.

The component arrangement can have a seal for the hollow space along the outline of the component. The seal is realized, e.g., by a laminating process. Through this seal, the component is protected on all sides. The laminating process includes, e.g., applying a film that can be laminated, that is, deformed. This process can be assisted through pressure on the film, through an increase in temperature, or through suctioning the film onto the carrier substrate. The film has a one-layer or multilayer construction and comprises at least one plastic film.

In another embodiment, the metallic contact surfaces of the first type are covered in the region around the bumps with a mask layer. This mask layer defines under-bump metallization (UBM). The UBM limited in this way allows a defined change of the spatial shape of the bumps through the soldering process through the given shape and area of the UBM. However, it is also possible to limit the UBM only on two side lines by the mask layer, so that the molten bump is slightly contaminated by the material of the mask layer.

In one embodiment, the component arrangement contains at least two layers of glass film and a recess running along the outline of the component. This recess runs from the side facing the component through the first glass film up to a contact plane. This contact plane is formed by a second glass film, on which metallization is applied at least in the entire area of the recess. The cover layer encompassing a metallic layer and the metallization are connected to each other in an electrically conductive way and form a hermetic connection to the second glass film of the carrier substrate. The entire recess is provided with the cover layer encompassing a metallic layer. Thus, the entire recess is equipped with a metallic layer. This arrangement has the advantage that the component is hermetically encapsulated.

The recess may be implemented via laser drilling or through etching technology combined with laser structuring. The distance of the component from this recess equals, e.g., ca. 50 μm. The width of the recess equals ca. 30 μm to 100 μm. This structural configuration reduces the distance between the component edge and the outer extent of the component arrangement.

To reduce processing times, the thickness of the glass film directly adjacent to the component may be smaller than the thickness of the other glass film. The thickness of the other glass film may be between ca. 50 to 100 μm.

In one embodiment of the component arrangement, the ground contacts of the component are connected in an electrically conductive way to the cover layer with metallic characteristics and the metallization arranged on the contact plane. The connection can be realized, e.g., via a pressure contact, with the film with metallic characteristics on the contact connected to ground on the surface of the carrier substrate. With this electrical connection, the number of necessary bumps may be reduced. This has the additional advantage that the size of the component arrangement is reduced also. This advantage of the reduced size of the component produces, for the same requirements, a smaller required height of the bumps. Consequently, the UBM area can be reduced. Through this reduction of the necessary UBM areas, the area requirements on the component arrangement can be reduced even more.

Embodiments are explained below with reference to the schematic drawings.

DESCRIPTION OF THE DRAWINGS

FIG. 2, comprised of FIGS. 2A, 2B and 2C, shows a cross section through different component arrangements with different layers.

DETAILED DESCRIPTION

Figure 1:
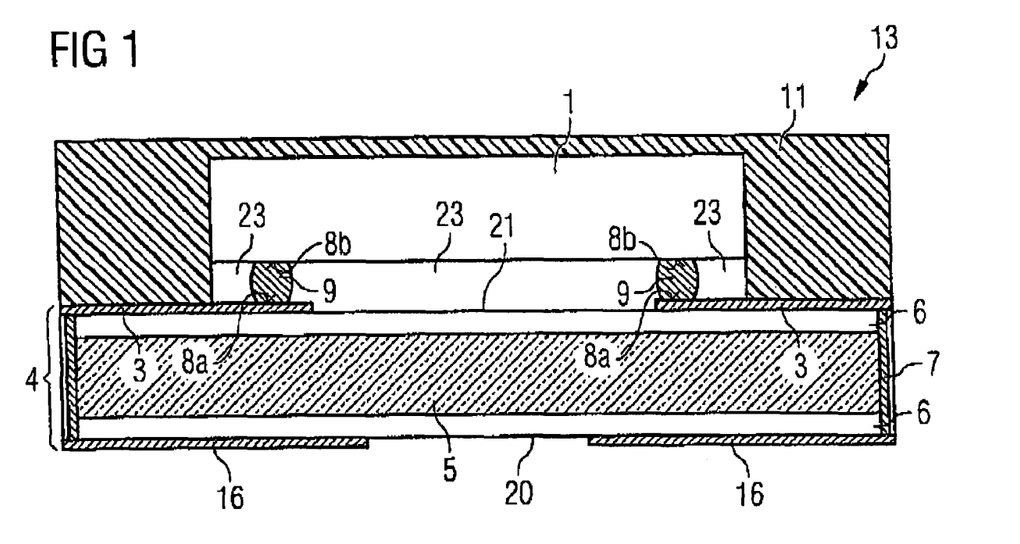
FIG. 1 shows a cross section through a component arrangement.

FIG. 1 shows an embodiment of the component arrangement 13. A layer of glass film 5 includes, on both sides, an intermediate layer 6, e.g., made from polymers, such as epoxy resin-containing polymers or high-temperature polymers, e.g., polyimide (Kapton®), BCB (benzocyclobutene), or PBO (polybenzoazole), and thus forms the carrier substrate 4. Metallic layers, e.g., conductor tracks 3 and contact element 16, are arranged on this intermediate layer 6. The glass film 5 is ca. 50 μm to 100 μm thick and is may be cut from laser-structured glass or single-crystal quartz, such that the anisotropic coefficient of expansion of the glass film matches the anisotropic coefficient of expansion of an LiTaO$_3$ chip used as the substrate. Liquid crystal polymer glass (LCP) with matched isotropic or anisotropic coefficients of expansion can also be used. The conductor tracks 3 can be implemented through an adhered copper film and then through structuring etching of the copper film. The structured copper layer is provided with a nickel/gold coating in an electroless or electroplating process, e.g., on the top side 21 and the bottom side 20 of the carrier substrate 4, in order to suppress corrosion or oxidation. A component 1 is mounted on the top side 21 of the carrier substrate 4. A hollow space 23 is formed between the component 1 and the carrier substrate 4. The electrical connection between the conductor tracks 3 or the contact surfaces of the first type of the carrier substrate 4 to the metallic contact surfaces 8 of the second type of the component 1 is implemented via bumps 9. A cover layer 11, e.g., a glob top, is applied on the carrier substrate 4 and the component 1.

The electrical connection between the conductor tracks 3 on the top side 21 and the contact elements 16 on the bottom side 20 of the carrier substrate 4 is implemented via feedthrough contacts 7. The feedthrough contacts 7 and also the vias are implemented through drilling or etching of 50 μm to 400 μm holes and then electroless metallization of the insides of these holes. Small holes or vias can also be filled or metallized by means of plugging. The feedthrough contacts 7 can be arranged between two components for a large-surface-area carrier substrate, so that for both components they simultaneously represent the electrical connections to the bottom side 20 of the carrier substrate and are divided by cutting the carrier substrate when the component arrangement is separated into single units such that each half is added to one of the components.

Figure 2A:
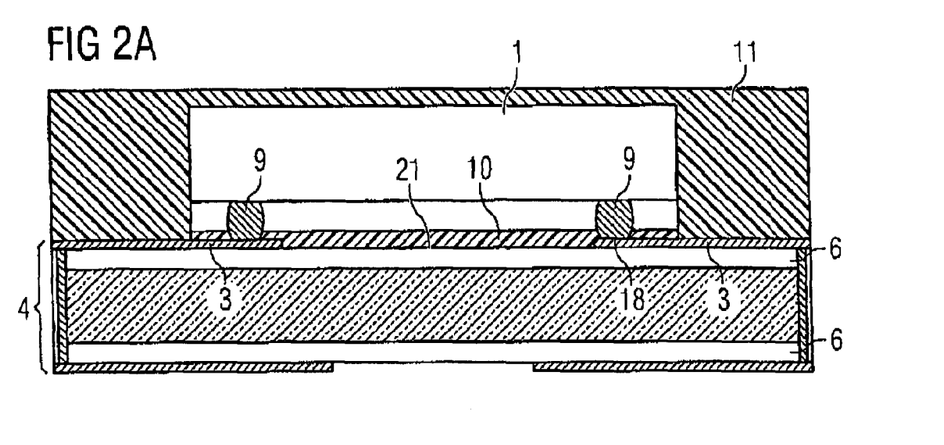
Figure 2B:
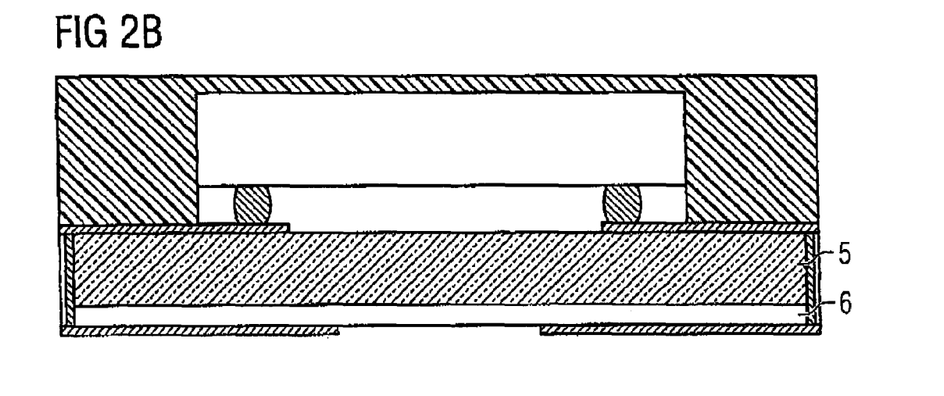
Figure 2C:
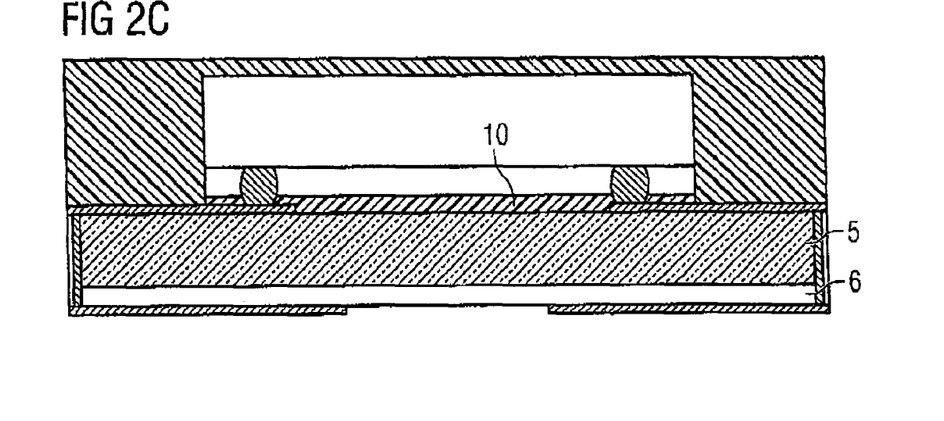

In FIG. 2A, a mask layer 10 is also arranged on the carrier substrate 4. This mask layer 10 has the function of limiting and defining under-bump metallization 18 (UBM). With this UBM 18, the conductor tracks 3, which are located on the top side 21 of the carrier substrate 4, are partially covered. The UBM 18 defines an area within the conductor track 3, which, for components 1 with bumps 9, defines the position of soldering but also the dissolving of the bumps 9 during the soldering. As additional embodiments, FIGS. 2B and 2C show that both conductor tracks 3 and also the mask layer 10 can be applied directly onto the glass film 5 without an intermediate layer 6.

Figure 3:
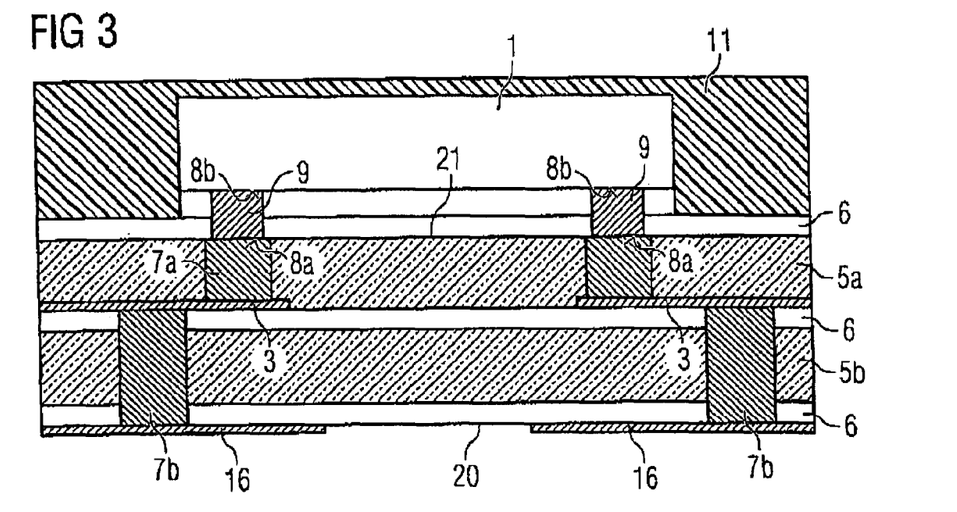
FIG. 3 shows a cross section through a component arrangement on a carrier substrate made from several layers of glass film.

FIG. 3 shows a section through another embodiment of the component arrangement 13. This embodiment has two layers of glass film 5a, 5b, with mutually offset feedthrough contracts 7a, 7b, with three intermediate layers 6, with conductor tracks 3, and with contact elements 16 mounted on the bottom side 20. The component 1 and, above this, the cover layer 11 are mounted on the top side 21 of the carrier substrate 4. The bumps 9, with which the contact surfaces of the first type 8a of the carrier substrate 4 are connected to the contact surfaces of the second type 8b of the component 1, can be arranged directly over a feedthrough contact 7a, 8a.

Figure 4:
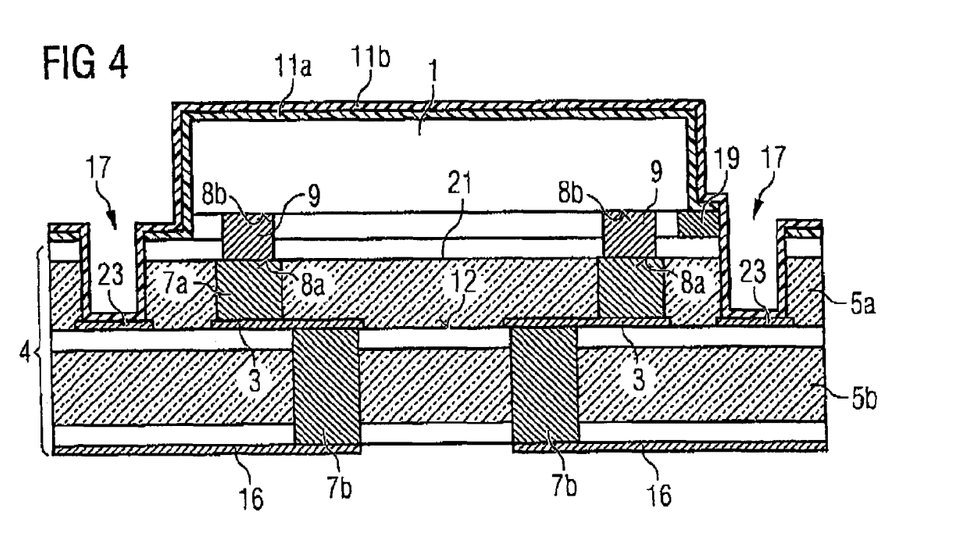
FIG. 4 shows a cross section through a component arrangement on a carrier substrate made from several layers of glass film and a recess.

FIG. 4 shows a cross section through another embodiment of the component arrangement 13. A component 1 in hermetic construction is mounted on at least two layers of glass film 5a, 5b, with mutually offset feedthrough contacts 7a, 7b, conductor tracks 3, and contact elements 16. The hermetic seal of the component 1 is implemented by the cover layers 11a, 11b.

A recess 17, extending around the component 1, is formed in the glass film 5a facing the component. The recess 17 can be formed completely by the first glass film 5a and can end via metallization 23 on the intermediate layer between the first and second glass film 5a, 5b or via the second glass film 5b. However, it can also end in the first glass film. A suitable width of the recess 17 is ca. 30 μm to 100 μm. Metallization on the contact plane 12, which here is formed by the other glass film 5b or the intermediate layer on this glass film, is arranged between the first glass film 5a with a thickness of ca. 20 μm and another glass film 5b with a typical thickness of ca. 50 to 100 μm. The conductor tracks 3, e.g., are structured from the metallization. The metallization 23 in the recess 17 extends at a distance of ca. 50 μm along the outline of the component 1 on the contact plane 12 and is connected to a ground connection of the component.

The rear side of the component 1 is covered with a cover layer 11a. The cover layer 11a connects to the top side 21 of the carrier substrate 4 and is removed in the recess 17. A titanium/copper layer is sputtered onto this cover layer 11a or a copper layer is applied in an electroless process. Furthermore, this cover layer 11b is reinforced galvanically and protected with a galvanic nickel layer.

The metallic cover layer 11b is electrically connected to the metallization 23 formed between the first glass film 5a and the other glass film 5b on the contact plane 12 and the ground 19 of the component 1.

The bumps 9, with which the contact surfaces of the first type 8a of the carrier substrate 4 are connected to the contact surfaces of the second type 8b of the component 1, can be arranged directly over a feedthrough contact 7a, 7b.

In the area of the recess 17 in FIG. 4, the actual sealing surface between the cover layer 11b and the carrier substrate is indicated with arrows. Here, the metal of the cover layer and a gas-tight medium (glass film or metallization 23) are in contact and form a tight connection.

Figure 5:
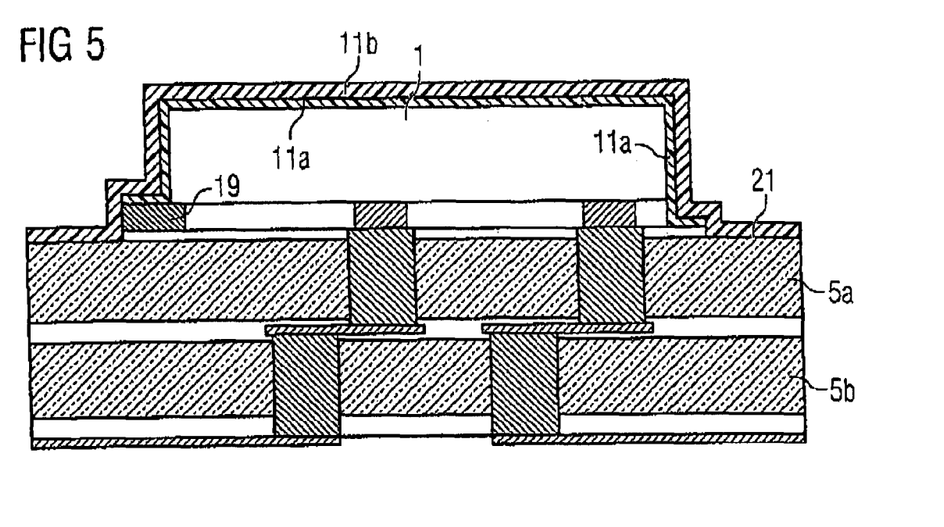
FIG. 5 shows a cross section through a component arrangement on a carrier substrate made from several layers of glass film with metallic cover.

FIG. 5 shows a cross section through another embodiment of a component arrangement 13. This figure shows a hermetic seal without the recesses 17 shown in FIG. 4. A metallic cover layer 11b is shown with metallization 19, which has a connection to the ground of the component 1. Another cover layer 11a, e.g., a laminate film, is provided between the component 1 and the metallic cover layer 11b. The metallic cover layer 11b connects to the top side 21 of the glass film 5a. The cover layers 11 implement the hermetic sealing.

In all of the embodiments with multilayer glass lamination, it is also possible to structure the glass films 5 or metallization on the intermediate layers 6 so that integrated, passive electrical components, which can be inductors, capacitors, or resistors, are implemented in the carrier substrate. In this way, it is possible to integrate circuit structures, networks, and interface circuits into the carrier substrate.

Figure 6:
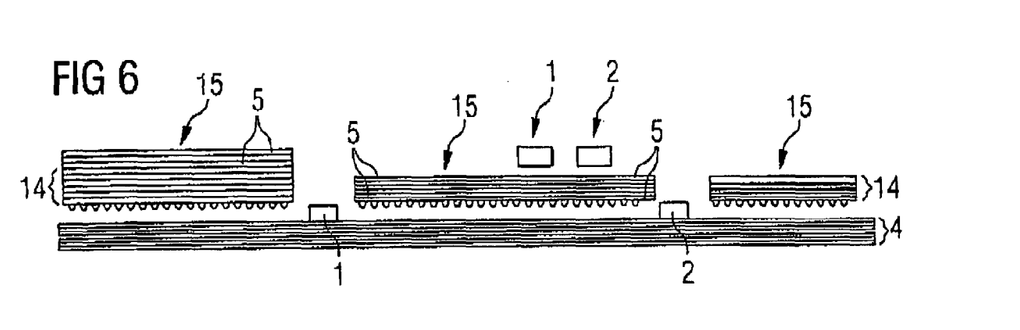
FIG. 6 shows the modular construction of substrates on a carrier substrate made from several layers of glass film.

FIG. 6 shows in an exploded view the arrangement of several substrates 15 on a carrier substrate 4. The substrates 15 can be composed only from LTCC 14 (see the substrate shown at the far right in the figure), from LTCC 14 and optionally multilayer laminates with glass films 5 (see the substrate shown at the far left in the figure), or only from optionally multilayer laminates with glass films 5 (see the substrate shown in the middle in the figure). The substrates are connected to the carrier substrate 4 in the proper arrangement. Chips 2 carrying components 1 or component structures on both sides can be arranged on the substrates 15 and on the carrier substrate 4.

In this construction, the nearly identical coefficients of expansion of the glass film 5 and LTCC 14 is used in order to achieve a stress-free connection of the two materials in a component arrangement. Active and passive components 1 can be arranged on the substrate 15 and the carrier substrate 4. By the matched coefficients of expansion, the otherwise necessary processing step of underfilling between the substrate 15 and the carrier substrate 4 is no longer required. In the carrier substrate 4, as well as in the multilayer substrates 15, passive components and active components can be integrated, e.g., inductors, capacitors, or resistors. The structures of the inductor and these components are generated, e.g., from copper using photolithography. Thus, low electrical resistance, e.g., of the inductor, are guaranteed.

Figure 7:
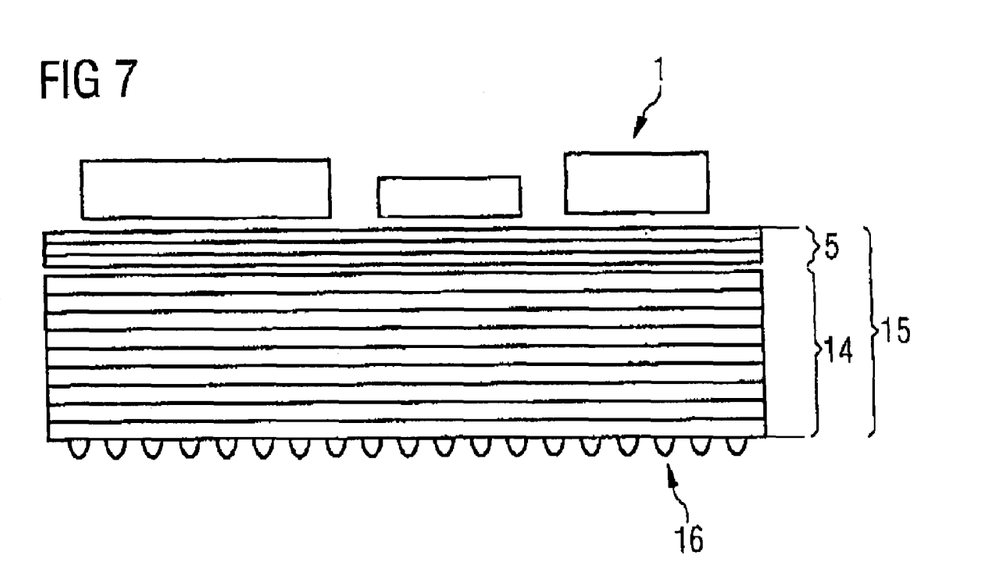
FIG. 7 shows the arrangement of components on a carrier substrate made from several layers of glass film.

FIG. 7 shows a substrate 15 in cross section. The substrate 15 comprises several layers of LTCC 14 and several layers of glass film 5. The components 1 are mounted on the side of the substrate, on which the glass films 5 are arranged. The contact elements 16 are arranged on the opposite side or a different side. Structured metallization planes, in which electrical connection lines and the structures of integrated passive components can be implemented, can be provided between all of the LTCC layers just like between all of the glass films. Different metallization planes can be interconnected through feedthrough contacts.

For clarity, these possible metallization planes 22, conductor tracks 3, intermediate layers 6, feedthrough contacts 7, and metallic contact surfaces 8, as well as the bumps 9, mask layer 10, cover layers 11, and UBMs 18, are not shown.

What is claimed is:

1. A component arrangement comprising:
    a carrier substrate;
    a component on the carrier substrate; and
    a cover layer on the carrier substrate, the cover layer being over the component and forming a seal with the carrier substrate to seal the component;
    wherein the carrier substrate comprises:
        at least two layers of glass film, the at least two layers of glass film comprising a first glass film and a second glass film, and
        an intermediate layer over the first glass film;
    wherein a recess in the carrier substrate extends along an exterior of the component, the recess extending through the first glass film from a side of the carrier substrate facing the component to a contact plane;
    wherein the contact plane comprises the second glass film and a metallization on the second glass film; and
    wherein the cover layer is electrically connected to the metallization that is part of the contact plane.

2. The component arrangement of claim 1, wherein the carrier substrate comprises a composite comprised of glass film and a low temperature co-fire ceramic.

3. The component arrangement of claim 1, wherein the carrier substrate comprises a multilayer substrate.

4. The component arrangement of claim 3, wherein the multilayer substrate comprises low temperature co-fire ceramic.

5. The component arrangement of claim 1, wherein the component comprises a module.

6. The component arrangement of claim 1, wherein the component is mounted over the at least two layers of glass film.

7. The component arrangement of claim 1, further comprising:
    a chip comprising a component structure.

8. The component arrangement of claim 1, further comprising:
    a chip comprising a surface acoustic wave component.

9. The component arrangement of claim 1, wherein the cover layer has metallic characteristics.

10. The component arrangement of claim 1, wherein the cover layer comprises a glob top made from thermosetting resin.

11. The component arrangement of claim 1, further comprising:
    a contact element on a bottom of the carrier substrate;
    wherein the contact element is electrically connected to the component.

12. The component arrangement of claim 11, wherein the carrier substrate comprises a feedthrough contact that extends from a first side of the carrier substrate nearest to the component towards the bottom of the carrier substrate.

13. The component arrangement according to claim 11, wherein the carrier substrate comprises feedthrough contacts that extend through at least two layers of glass film to the contact element, the feed through contacts being offset from each other.

14. The component arrangement of claim 1, wherein the carrier substrate comprises a first metallic contact surface, and the component comprises a second metallic contact surface; and
    wherein the component arrangement comprises an electrical connection between the first metallic contact surface and the second metallic contact surface, the electrical connection comprising bumps.

15. The component arrangement of claim 1, which has a hollow space between the component and the carrier substrate, the hollow space being formed by the cover layer sealing to the carrier substrate.

16. The component arrangement of claim 14, further comprising a mask layer in a region around the bumps, the mask layer substantially covering the first metallic contact surfaces.

17. The component of claim 1, wherein a thickness of the first glass film, which is adjacent to the component, is less than a thickness of a layer of glass film that is not adjacent to the component.

18. The component arrangement of claim 17, wherein a thickness of the layer of glass film that is not adjacent to the component is between 50 µm to 100 µm.

19. The component arrangement of claim 1, wherein a ground connection of the component is electrically connected to the cover layer.

20. The component arrangement of claim 1, wherein the carrier substrate is multilayered; and
    wherein passive components are integrated in the carrier substrate, the passive components being electrically connected to the component to form a circuit structure.

* * * * *

UNITED STATES PATENT AND TRADEMARK OFFICE
CERTIFICATE OF CORRECTION

PATENT NO. : 7,608,789 B2 Page 1 of 1
APPLICATION NO. : 11/573610
DATED : October 27, 2009
INVENTOR(S) : Hans Krueger It is certified that error appears in the above-identified patent and that said Letters Patent is hereby corrected as shown below:

Column 8, Claim 17, Line 41:
Insert --arrangement-- after "component-"

Column 8, Claim 19, Line 48:
Insert --arrangement-- after "component-"

Signed and Sealed this

Nineteenth Day of January, 2010

David J. Kappos
*Director of the United States Patent and Trademark Office*

UNITED STATES PATENT AND TRADEMARK OFFICE
CERTIFICATE OF CORRECTION

PATENT NO. : 7,608,789 B2  Page 1 of 1
APPLICATION NO. : 11/573610
DATED : October 27, 2009
INVENTOR(S) : Hans Krueger

It is certified that error appears in the above-identified patent and that said Letters Patent is hereby corrected as shown below:

Title Page, Column 1, PCT Pub No.:
Delete "WO2004/019490" and Insert --WO2006/018131--

Title Page, Column 1, PCT Pub Date:
Delete "Mar. 4, 2004" and Insert --Feb. 23, 2006--

Signed and Sealed this

Twentieth Day of July, 2010

David J. Kappos
*Director of the United States Patent and Trademark Office*

UNITED STATES PATENT AND TRADEMARK OFFICE
CERTIFICATE OF CORRECTION

PATENT NO. : 7,608,789 B2  Page 1 of 1
APPLICATION NO. : 11/573610
DATED : October 27, 2009
INVENTOR(S) : Hans Krueger It is certified that error appears in the above-identified patent and that said Letters Patent is hereby corrected as shown below:

Column 8, Claim 17, Line 41:
Insert --arrangement-- after "component-"

Column 8, Claim 19, Line 48:
Insert --arrangement-- after "component-"

Signed and Sealed this

Tenth Day of August, 2010

David J. Kappos
*Director of the United States Patent and Trademark Office*